United States Patent
Huang

(10) Patent No.: US 12,419,011 B2
(45) Date of Patent: Sep. 16, 2025

(54) LIQUID COOLING DEVICE WITH A HEAT-RESISTING STRUCTURE

(71) Applicant: Tsung-Hsien Huang, I-Lan Hsien (TW)

(72) Inventor: Tsung-Hsien Huang, I-Lan Hsien (TW)

(*) Notice: Subject to any disclaimer, the term of this patent is extended or adjusted under 35 U.S.C. 154(b) by 220 days.

(21) Appl. No.: 18/205,922

(22) Filed: Jun. 5, 2023

(65) Prior Publication Data

US 2024/0381568 A1 Nov. 14, 2024

(30) Foreign Application Priority Data

May 9, 2023 (TW) .................................. 112117110

(51) Int. Cl.
*F28D 1/053* (2006.01)
*F28F 9/02* (2006.01)
*H05K 7/20* (2006.01)

(52) U.S. Cl.
CPC ..... *H05K 7/20263* (2013.01); *F28D 1/05366* (2013.01); *F28F 9/0282* (2013.01); *F28F 2009/029* (2013.01); *F28F 2250/08* (2013.01); *H05K 7/20272* (2013.01)

(58) Field of Classification Search
CPC ............ H05K 7/20272; H05K 7/20263; F28F 2250/08; F28F 2009/029
See application file for complete search history.

(56) References Cited

U.S. PATENT DOCUMENTS

| 6,357,521 | B1* | 3/2002 | Sugimoto | ............ F28D 1/05366 165/173 |
| 2011/0056668 | A1* | 3/2011 | Taras | ............ F28F 9/262 165/174 |
| 2019/0075681 | A1* | 3/2019 | Xiao | ............ F28F 1/126 |
| 2019/0242661 | A1* | 8/2019 | Huang | ............ F28F 1/006 |
| 2020/0236807 | A1* | 7/2020 | Deng | ............ F28F 27/02 |
| 2022/0290930 | A1* | 9/2022 | Xiao | ............ F28F 1/30 |

FOREIGN PATENT DOCUMENTS

JP 2004218983 A * 8/2004 ............. F28F 13/00

OTHER PUBLICATIONS

Translation of JP2004218983A named Translation—JP2004218983A (Year: 2004).*

* cited by examiner

*Primary Examiner* — Paul Alvare
(74) *Attorney, Agent, or Firm* — Ying-Ting Chen; Law Office of Michael Chen

(57) ABSTRACT

An integrated liquid cooling device with a heat-resisting structure includes an internal circulation type liquid cooling radiator, a liquid cooling head and a liquid pump. A liquid collection box of the internal circulation type liquid cooling radiator has an air heat insulation space inside, which divides the interior into a cold liquid chamber and a hot liquid chamber, so that the hot liquid flowing into the hot liquid chamber is prohibited from conducting heat to the cold liquid in the cold liquid, preventing the cold liquid from being abnormally heated and degrading the cooling effect. In addition, the two ends of the radiator pipes of the internal circulation type liquid cooling radiator form a respective trumpet pipe wall that is stuck in the liquid collection box, which can increase the strength of the connection in the liquid collection box.

8 Claims, 7 Drawing Sheets

LIQUID COOLING DEVICE WITH A HEAT-RESISTING STRUCTURE

BACKGROUND OF THE INVENTION

(a) Field of the Invention

The invention relates to the field of heat dissipation for computers and servers, in particular to an integrated liquid cooling device with a heat-resisting structure, which can prevent heat transfer from hot liquid circulating inside the liquid cooling device to cold liquid.

(b) Description of the Prior Art

The liquid cooling devices on today's computers and servers are usually composed of separate liquid cooling radiator, liquid cooling head, liquid pump and liquid pipes. The liquid pipes are connected between the liquid cooling radiator and the liquid cooling head, so that the coolant in the liquid cooling radiator and the liquid cooling head circulates. After the coolant absorbs heat on the liquid cooling head, it enters the liquid cooling radiator to dissipate heat, and the cooled cooling liquid flows back into the liquid cooling head. However, the liquid cooling radiator and the liquid cooling head of the above-mentioned liquid cooling device are arranged separately, and its structure is not compact, and it is relatively inconvenient to use. Moreover, there is no liquid pump function on the liquid collecting tank of the liquid cooling radiator, so that the flow speed of the cooling liquid in the liquid cooling radiator is relatively slow, and the heat dissipation efficiency is low. Moreover, there is no separation in the liquid collection tank, so that the flow of the coolant in the liquid cooling radiator is relatively short, resulting in the inability of the coolant to effectively cool down and dissipate heat.

Based on the above reasons, the inventor once proposed an integrated liquid cooling device (patent announcement U.S. Pat. No. 11,566,847B2) to solve the shortcomings of the conventional separated liquid cooling device. However, the liquid cooling radiator of the integrated liquid cooling device usually only uses a metal partition to separate the liquid collection box into a cold liquid chamber and a hot liquid chamber. When the liquid flowing through the liquid cooling head absorbs heat and turns into hot liquid and flows into the hot liquid chamber, it will conduct heat to the cold liquid in the adjacent cold liquid chamber through the metal partition, causing the cold liquid that is going to flow into the liquid cooling head to be heated first. Therefore, it affects the cooling effect after it flows into the liquid cooling head. Furthermore, the pipe and liquid collection box of the known liquid cooling radiator are welded and combined, and the inlet and outlet of the pipes do not take into account the fluidity of the liquid inflow and outflow, resulting in turbulent flow and flow velocity effects. In addition, the conventional liquid cooling radiator only relies on the liquid collection box connected to the two ends of the liquid pipes, and there is no other auxiliary design of the liquid collection box connecting the two ends, and its structural strength is easily affected by the wall strength of the liquid pipes. The thinner the pipe wall will lead to the more unstable structure of the overall liquid cooling radiator.

SUMMARY OF THE INVENTION

The main object of the present invention is to provide an integrated liquid cooling device with a heat-resisting structure, which can prevent the hot liquid heat in the hot liquid chamber from being transferred to the cold liquid in the adjacent cold liquid chamber, prevent the cold liquid from absorbing heat and increasing the temperature abnormally, and improve the cooling efficiency of the liquid cooling device through the structural design of a first liquid collection box, a second liquid collection box and radiator pipes connected between the first liquid collection box and the second liquid collection box of an internal circulation type liquid cooling radiator and an air heat insulation space set in the first liquid collection box, the integrated liquid cooling device.

The second object of the present invention is to provide an integrated liquid cooling device with a heat-resisting structure, wherein through the assembly structure design of the internal circulation type liquid cooling radiator, the pipe walls at both ends of the radiator pipes form a respective trumpet pipe wall that expands outward, and the trumpet pipe walls can hold the flat through holes of the first liquid collection box and the second liquid collection box to improve the structural strength of their combination and the smoothness of the working fluid flowing into and out of the radiator pipes.

Another object of the present invention is to provide an integrated liquid cooling device with a heat-resisting structure, wherein there are locking lugs protruding from both ends of the fan mounting frames, and the locking lugs are respectively embedded in the concave holes of the first liquid collection box and the second liquid collection box to enhance the structural strength of the combination.

DETAILED DESCRIPTION OF THE PREFERRED EMBODIMENTS

Figure 1:
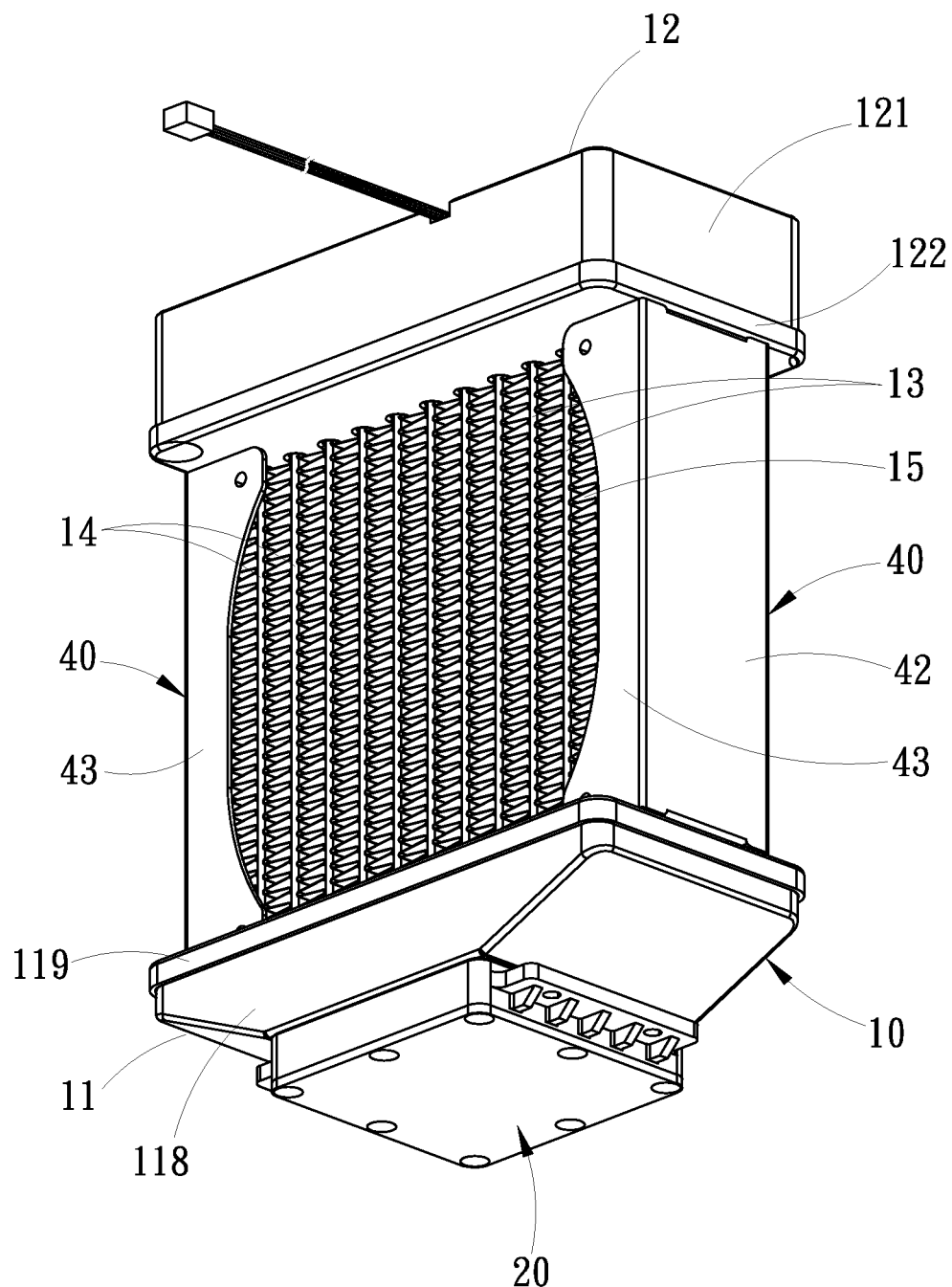
FIG. 1 is a three-dimensional schematic diagram of a preferred embodiment of the present invention.
Figure 2:
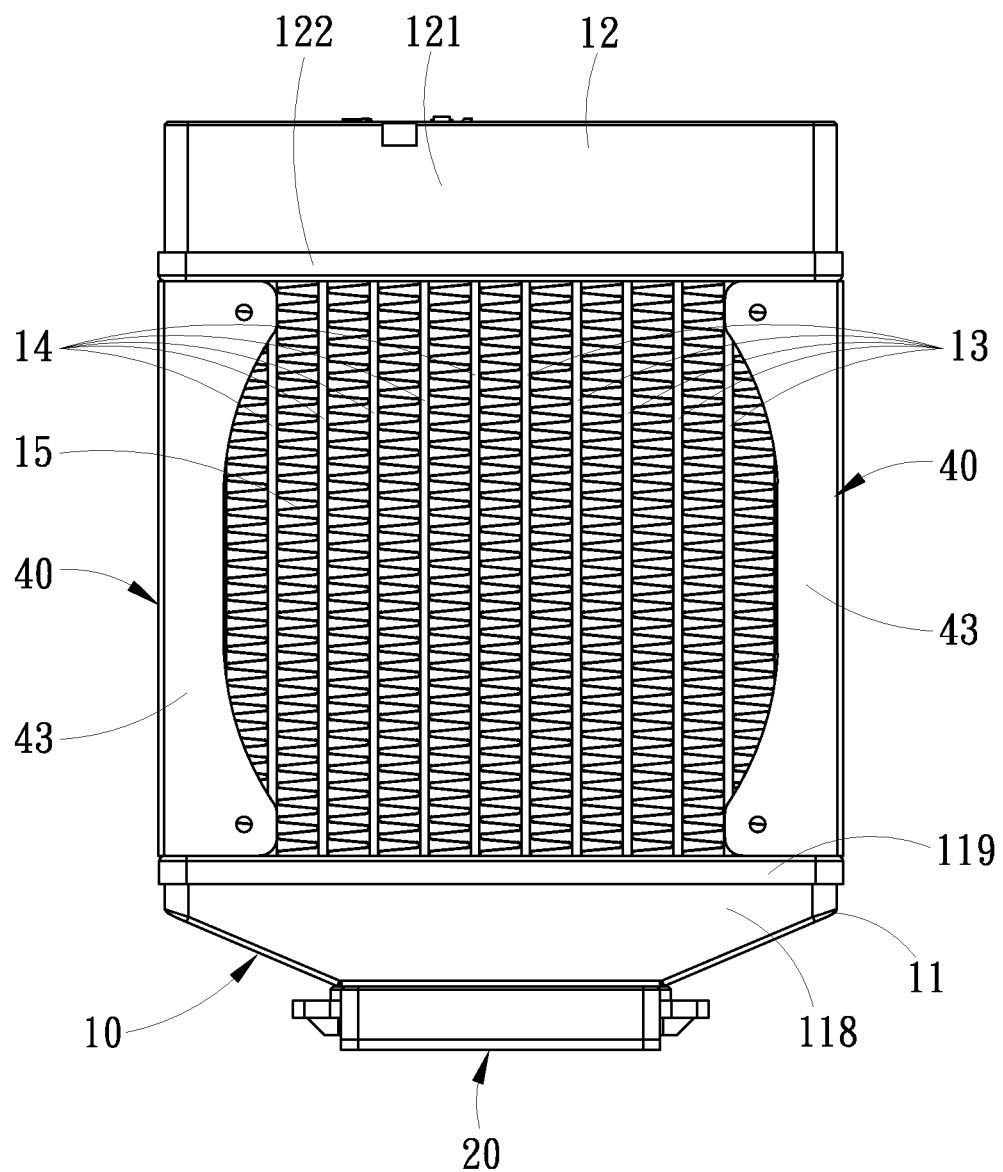
FIG. 2 is a schematic diagram of the front view of the preferred embodiment of FIG. 1 of the present invention.

The present invention is an integrated liquid cooling device with a heat-resisting structure, which is used to replace the traditional air cooling device installed on the processor inside the computer or server, and liquid-cool the processor to prevent the temperature from being too high. As shown in FIG. 1 and FIG. 2, its preferred embodiment comprises an internal circulation type liquid cooling radiator 10, a liquid cooling head 20 and a liquid pump 30.

The internal circulation type liquid cooling radiator 10 preferably implements a first liquid collection box 11, a second liquid collection box 12 and a plurality of first radiator pipes 13 and second radiator pipes 14. The first liquid collection box 11 and the second liquid collection box 12 are hollow metal boxes respectively used for liquid collection, such as boxes made of aluminum alloy. The plurality of first radiator pipes 13 and second radiator pipes 14 are flat metal pipes whose two ends are respectively fixedly combined with the first liquid collection box 11 and the second liquid collection box 12, and connected to the first liquid collection box 11 and the second liquid collection box 12, so that the working liquid in the first liquid collection box 11 flows into the second liquid collection box 12 through the first radiator pipes 13, and then flows into the first liquid collection box 11 through the second radiator pipes 14, forming the closed internal circulation type liquid cooling radiator. In addition, the plurality of first radiator pipes 13 and second radiator pipes 14 are provided with a plurality of heat dissipation fins 15, so that the working liquid can dissipate heat when flowing through the first radiator pipes 13 and second radiator pipes 14. The liquid cooling head 20 is an existing item, such as the liquid cooling head shown in the patent announcement U.S. Pat. No. 11,566,847B2 or other liquid cooling heads that can be directly combined with the liquid cooling radiator. It is fixedly combined with the outside of the first liquid collection box 11, and is used for cooling the surface of the processor in the computer or server. The liquid pump 30 is arranged in the second liquid collection box 12, which has a known motor and impeller structure, and can be used to drive the circulating flow of working fluid in the internal circulation type liquid cooling radiator 10 to pass through the liquid cooling head 20 for cooling (heat absorption), and dissipate heat when circulating in the first radiator pipes s and second radiator pipes 14.

Figure 3:
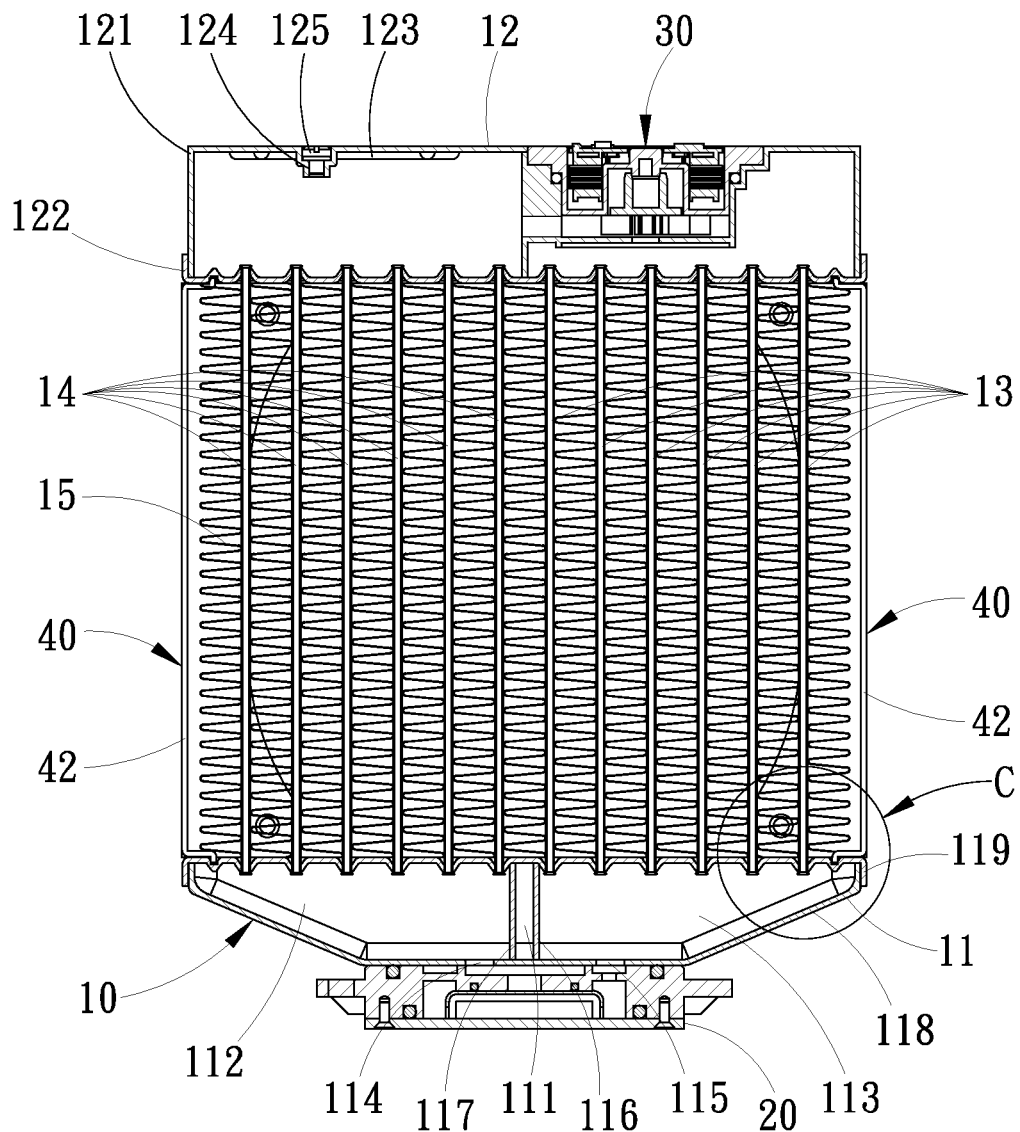
FIG. 3 is a cross-sectional schematic diagram of the preferred embodiment of FIG. 2 of the present invention.
Figure 4:
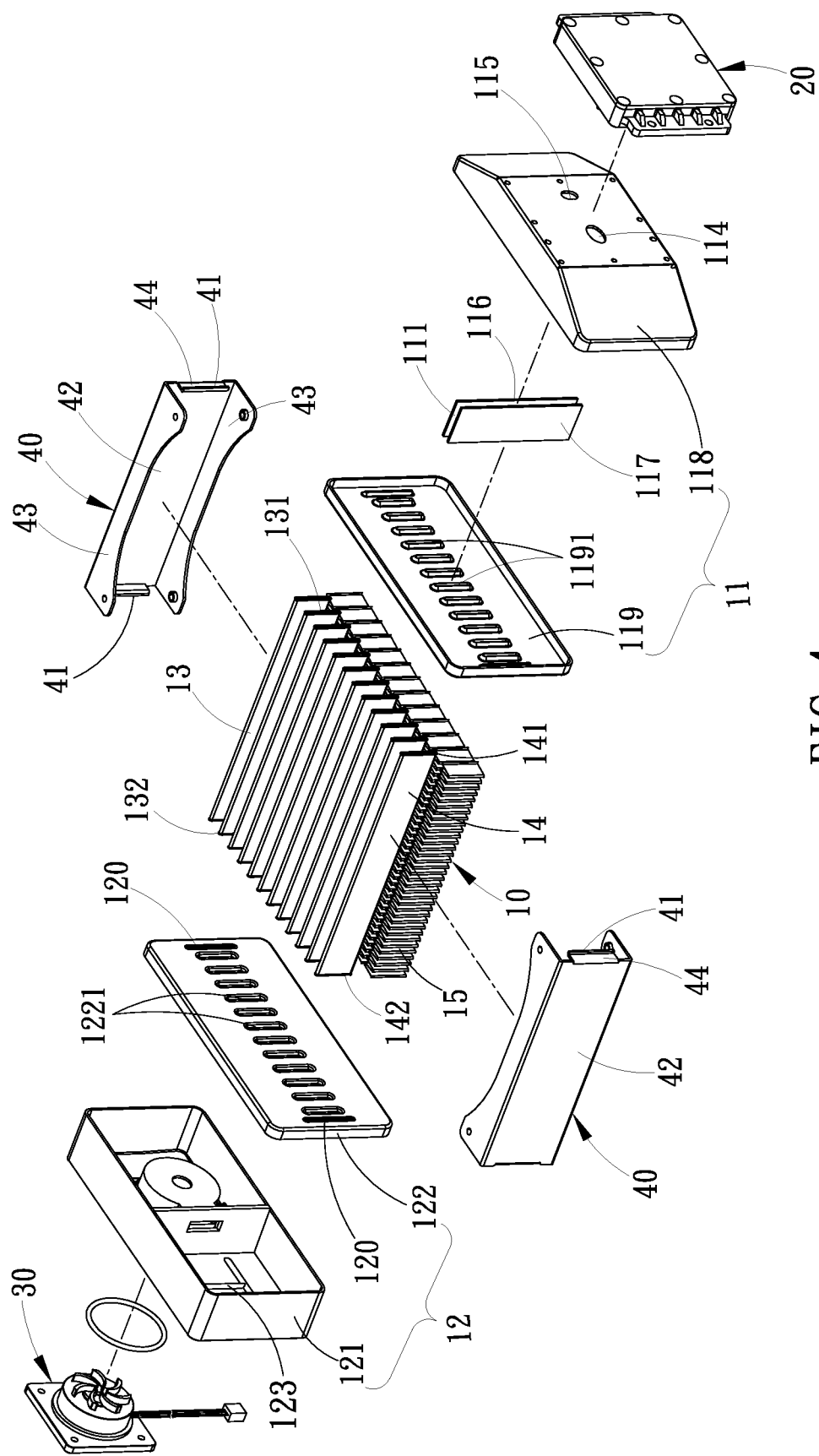
FIG. 4 is an exploded schematic view of the preferred embodiment of FIG. 1 of the present invention.

As shown in FIG. 3 and FIG. 4, an air heat insulation space 111 is set inside the above-mentioned first liquid collection box 11 of the present invention, and the air heat insulation space 111 partitions the interior of the first liquid collection box 11 into a cold liquid chamber 112 and a hydrothermal chamber 113. The box wall of the cold liquid chamber 112 is provided with a cold liquid inlet 114 for the working liquid to flow from the cold liquid chamber 112 to the liquid cooling head 20. The box wall of the hot liquid chamber 113 is provided with a hot liquid inlet 115 for returning the working liquid from the liquid cooling head 20 to the hot liquid chamber 113. The air heat insulation space 111 is composed of a hot liquid partition 116 and a cold liquid partition 117 arranged inside the first liquid collection box 11 and separated by a distance. The periphery of the hot liquid partition 116 and the periphery of the cold liquid partition 117 are welded on the inner surface of the first liquid collection box 11, and are located at the position between the first radiator pipes 13 and the second radiator pipes 14 (as shown in FIG. 3), so that the above-mentioned air heat insulation space 111 is formed between the hot liquid partition 116 and the cold liquid partition 117. Since the thermal conductivity of air is 0.025 W/m·K, and the thermal conductivity of aluminum is 237 W/m·K, the air heat insulation space 111 of the present invention can effectively prevent the heat transfer of the hot liquid flowing into the hot liquid chamber 113 to the cold liquid in the cold liquid chamber 112 next to it, preventing the cold liquid from being abnormally heated and ensuring the cooling efficiency of the cold liquid flowing into the liquid cooling head 20.

As shown in FIG. 3 and FIG. 4 again, the above-mentioned first liquid collection box 11 specifically comprises a first box body 118 and a first box cover 119. The first end of the first box body 118 is a tapered closed end, the liquid cooling head 20 is fixed outside the tapered closed end, the second end of the first box body 118 opposite to its first end is an open end. The first box cover 119 covers the open end of the first box body 118, and the first box cover 119 is provided with first flat through holes 1191 corresponding to the plurality of first radiator pipes 13 and second radiator pipes 14. The periphery of the above hot liquid partition 116 and the periphery of the cold liquid partition 117 are in close contact with three inner surfaces of the first box body 118 and the inner surface of the first box cover 119, thereby forming the above air heat insulation space 111. The above-mentioned second liquid collection box 12 specifically comprises a second box body 121 and a second box cover 122. The second box body 121 is a rectangular box, the first end of the second box body 121 is a closed end, and the second end of the second box body 121 opposite to the first end is an open end. The second box cover 122 covers the open end of the second box body 121, and the second box cover 122 is provided with second flat through holes 1221 corresponding to the plurality of first radiator pipes 13 and second radiator pipes 14.

Figure 5:
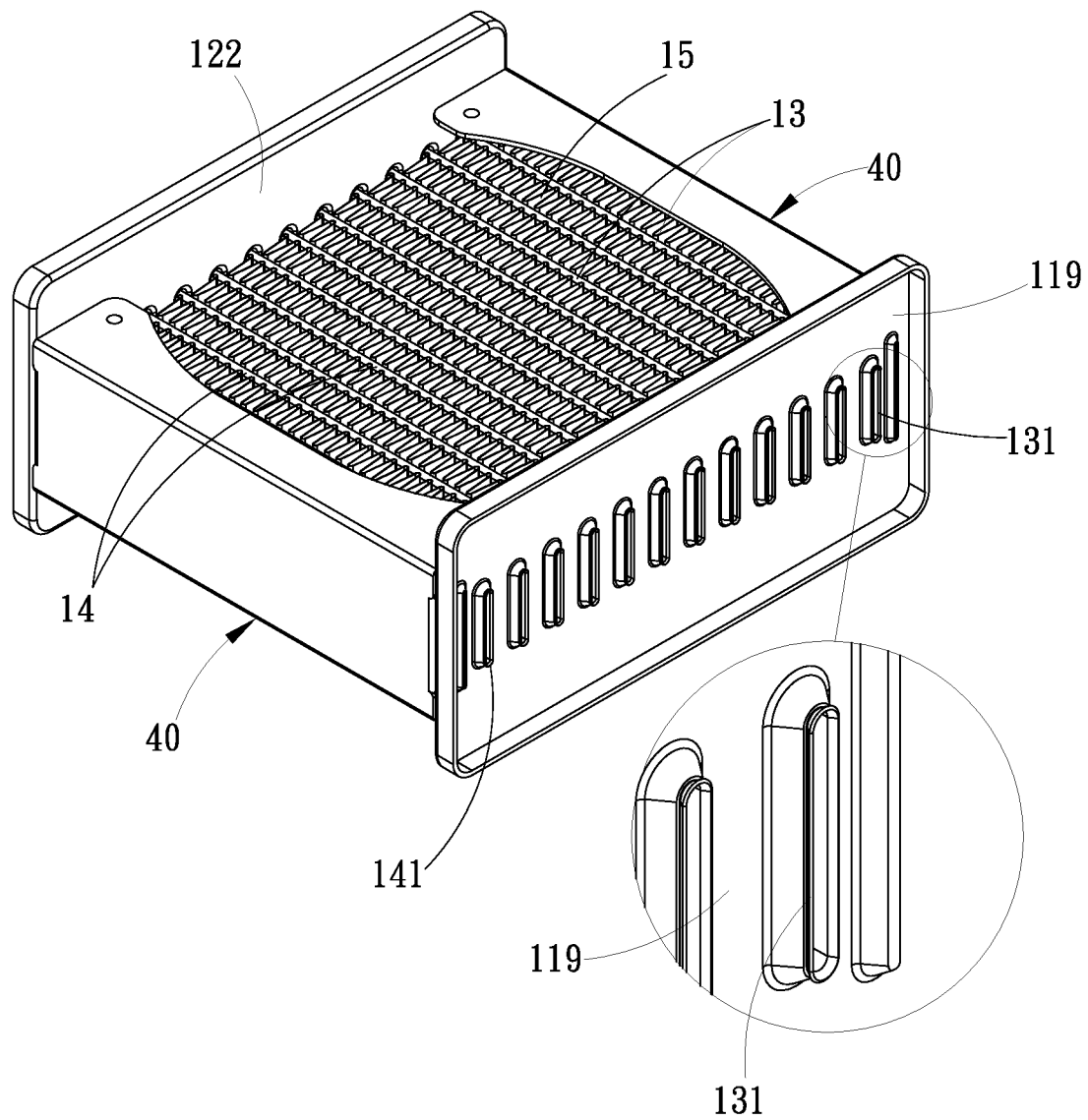
FIG. 5 is a three-dimensional schematic diagram of the assembly structure of the pipe end of the present invention.
Figure 6:
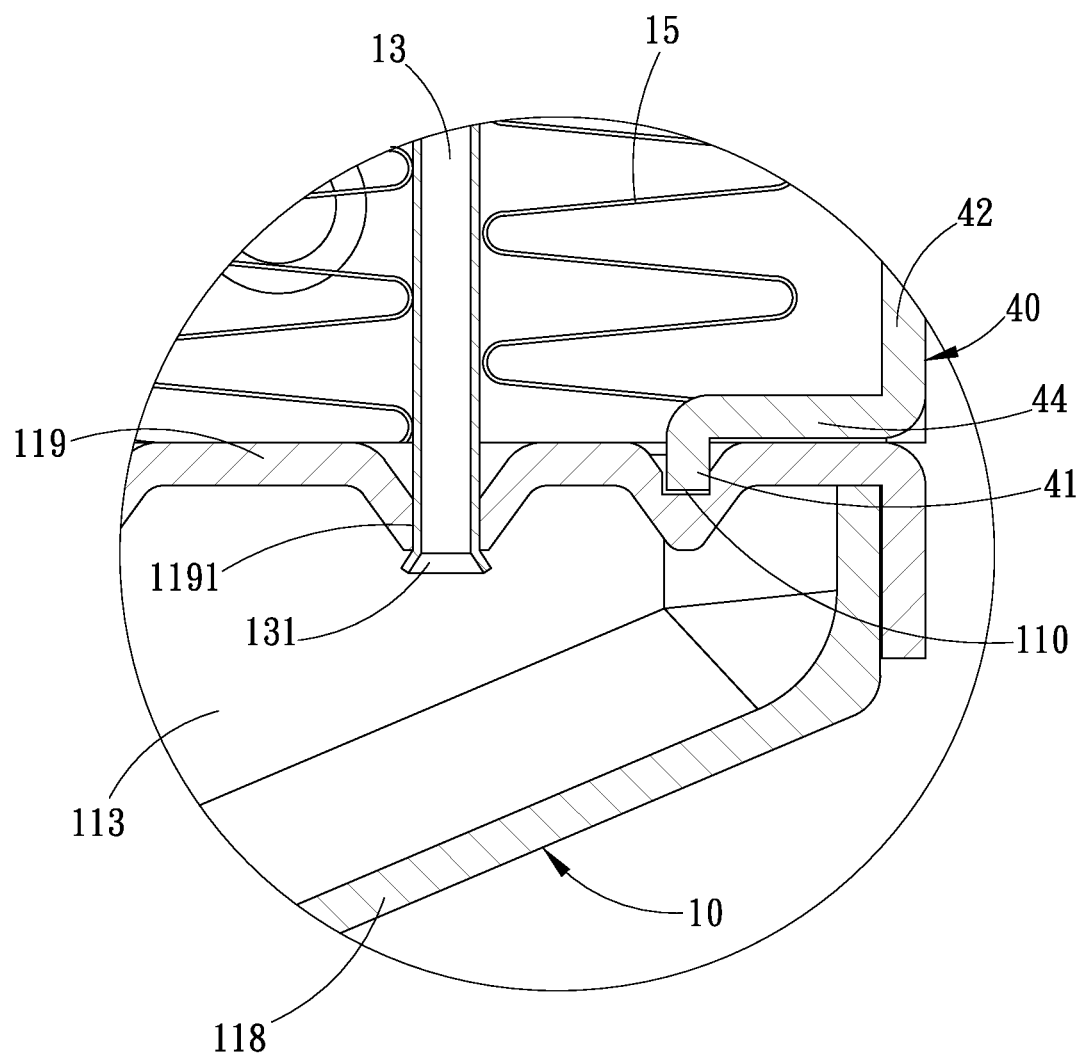
FIG. 6 is a partial schematic diagram at C in FIG. 3 of the present invention.

In order to improve the combined strength of the above-mentioned first radiator pipes 13 and second radiator pipes 14 in the above-mentioned first flat through holes 1191 and second flat through holes 1221, and at the same time improve the smoothness of the liquid flowing in and out, taking the end of the first liquid collection box shown in FIG. 4, FIG. 5 and FIG. 6 as an example, in the present invention, the first ends of the plurality of first radiator pipes 13 and second radiator pipes 14 protrude from the outer wall of the first box cover 119 through the first flat through holes 1191 to the inner surface of the first box cover 119, and make the pipe walls of the first ends of the plurality of first radiator pipes 13 and second radiator pipes 14 form a respective trumpet pipe wall 131, 141 that expands outwards. The outer wall surfaces of the trumpet pipe walls 131 and 141 abut against the surroundings of the first flat through holes 1191, so that they are not only stuck in the first flat through holes 1191, but also improve the smoothness of the fluidity of the liquid. Similarly, when the trumpet pipe walls 132, 142 the second ends of the first radiator pipes 13 and the second radiator pipes 14 of the present invention are combined with the second flat through holes 1221 of the second liquid collection box 12, the same structure as above can also be adopted.

As shown in FIG. 1 and FIG. 4 again, the preferred embodiment of the present invention further comprises two fan mounting frames 40, and the two fan mounting frames 40 are combined on both sides of the internal circulation type liquid cooling radiator 10. Each of the two ends of each fan mounting frame 40 respectively protrudes a locking lug 41 (as shown in FIG. 6), and the locking lugs 41 are respectively embedded in a respective concave hole 110, 120 corresponding to the position of the first liquid collection box 11 and the second liquid collection box 12. More specifically, each fan mounting frame 40 is integrally punched and formed from an aluminum alloy plate, and has a side plate 42 corresponding to the two sides of the internal circulation type liquid cooling radiator 10, and at least one panel 43 connected to at least one side of the side plate 42 (As shown in FIG. 4, it is two panels 43). The panel 43 is used to extend to one or both sides of the internal circulation type liquid cooling radiator 10, and a fan fixing hole is arranged on the panel 43. The two ends of the above-mentioned side plate 42 are respectively bent with an end plate 44 that fits on the outer walls of the first liquid collection box 11 and the second liquid collection box 12. The free ends of the two end plates 44 are bent to form the above locking lugs 41. Therefore, they are possible to embed the concave holes 110, 120 corresponding to the first liquid collection box 11 and the second liquid collection box 12. In this way, the assembly structural strength of the fan mounting frames 40 can be enhanced, and the overall structural strength of the internal circulation type liquid cooling radiator 10 can also be enhanced.

Figure 7:
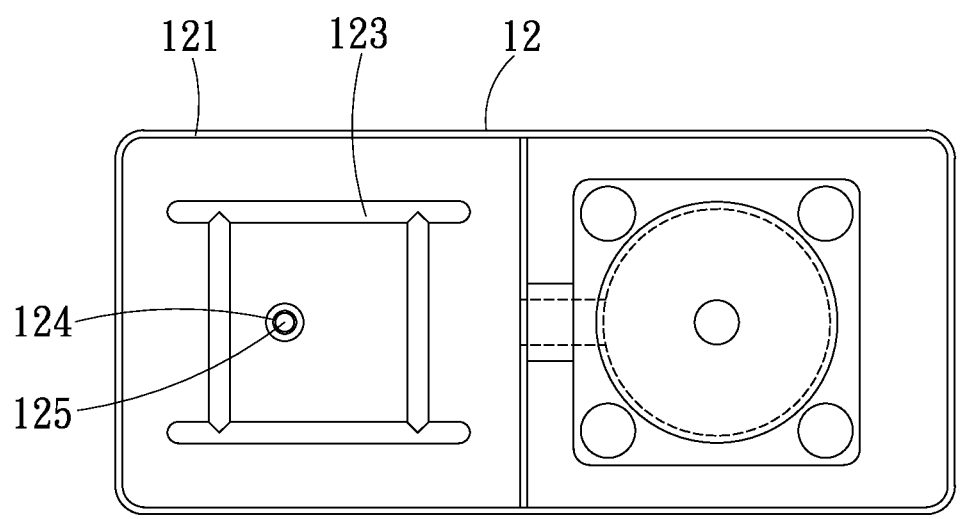
FIG. 7 is a schematic diagram of the internal rib structure of the second box body of the present invention.

As shown in FIG. 3 and FIG. 7, the second box body 121 of the second liquid collection box 12 of the present invention can be integrally formed with ribs 123 protruding from the inner or outer surface of the box wall. The structural strength of the second box body 121 can be improved through the structure of the ribs 123. Similarly, the above first box body 118 can also implement the same rib structure. Furthermore, the above-mentioned second box body 121 is provided with a liquid injection hole 124 and a hole plug 125 on the wall of the second box body 121, which are convenient for injecting and replenishing the working liquid of the liquid cooling device.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. An integrated liquid cooling device with a heat-resisting structure, comprising an internal circulation type liquid cooling radiator, a liquid cooling head and a liquid pump, wherein:
    said internal circulation type liquid cooling radiator comprises a first liquid collection box, a second liquid collection box, a plurality of first radiator pipes and a plurality of second radiator pipes; said first radiator pipes and said second radiator pipes being flat metal pipes with respective two ends thereof respectively combined with said first liquid collection box and said second liquid collection box and respectively connected to the inside of said first liquid collection box and the inside of said second liquid collection box; said first radiator pipes and said second radiator pipes being respectively externally provided with a plurality of heat dissipation fins;
    said first liquid collection box is internally provided with an air heat insulation space, said air heat insulation space dividing the interior of said first liquid collection box into a cold liquid chamber and a hot liquid chamber; said cold liquid chamber comprising a cold liquid inlet for a working liquid to flow from said cold liquid chamber to said liquid cooling head, said hot liquid chamber comprising a hot liquid inlet for said working liquid to flow back from said liquid cooling head to said hot liquid chamber, said air heat insulation space being composed of a hot liquid partition and a cold liquid partition arranged inside said first liquid collection box and separated by a distance, said hot liquid partition and said cold liquid partition being welded on the inner wall of said first liquid collection box, and being located between said first radiator pipe and said second radiator pipe, so that said air heat insulation space is formed between said hot liquid partition and said cold liquid partition; and
    said liquid cooling head is combined on the outside of said first liquid collection box, and said liquid pump is set in said second liquid collection box to drive said working liquid in said internal circulation type liquid cooling radiator to pass through said liquid cooling head for heat absorption and heat dissipation,
    wherein said first liquid collection box comprises a first box body and a first box cover, said first box body comprising a first end and an opposing second end, the first end of said first box body being a tapered closed end, the second end of said first box body being an open end, said first box cover covering the open end of said first box body, said first box cover being provided with a plurality of first flat through holes corresponding to said first radiator pipes and said second radiator pipes; said liquid cooling head is fixed on the outside of said tapered closed end of said first box body of said first liquid collection box; said hot liquid partition and said cold liquid partition are in close contact with three inner walls of said first box body and an inner wall of said first box cover.

2. The integrated liquid cooling device with a heat-resisting structure as claimed in claim 1, wherein the first ends of said first radiator pipes and said second radiator pipes protrude from an outer wall of said first box cover to the inner wall of said first box cover after passing through the respective said first flat through holes, the pipe walls of the first ends of said first radiator pipes and said second radiator pipes respectively forming a trumpet pipe wall that expands outward, said trumpet pipe wall having an outer wall surface thereof abutting against the periphery of one respective said first flat through hole.

3. The integrated liquid cooling device with a heat-resisting structure as claimed in claim 1, wherein said second liquid collection box comprises a second box body and a second box cover, said second box body being a rectangular box body, said second box body comprising a first end and an opposing second end, the first end of said second box body being a closed end, the second end of said second box body being an open end, said second box cover covering the open end of said second box body, said second box cover being provided with a plurality of second flat through holes corresponding to said first radiator pipes and said second radiator pipes.

4. The integrated liquid cooling device with a heat-resisting structure as claimed in claim 3, wherein the second ends of said first radiator pipes and said second radiator pipes protrude from an outer wall of said second box cover through said second flat through holes to an inner wall of said second box cover, the pipe walls of the second ends of said first radiator pipes and said second radiator pipes forming a respective trumpet pipe wall that expands outward, the trumpet pipe walls of said first radiator pipes and said second radiator pipes having a respective outer wall surface thereof abutting against the periphery of one respective said second flat through hole.

5. The integrated liquid cooling device with a heat-resisting structure as claimed in claim 3, wherein said second box body is integrally formed with a plurality of ribs protruding from inner or outer box wall thereof.

6. The integrated liquid cooling device with a heat-resisting structure as claimed in claim 3, wherein said second box body is provided with a liquid injection hole and a hole plug on a wall of said second box body.

7. The integrated liquid cooling device with a heat-resisting structure as claimed in claim 1, further comprising two fan mounting frames respectively combined on both sides of said internal circulation type liquid cooling radiator, each said fan mounting frame comprising two locking lugs respectively protruding from both ends thereof, and said locking lugs being respectively embedded in one respective concave hole of said first liquid collection box and one respective concave hole of said second liquid collection box.

8. The integrated liquid cooling device with a heat-resisting structure as claimed in claim 7, wherein each said fan mounting frame comprises a side plate corresponding to two sides of said internal circulation type liquid cooling radiator, at least one panel connected to at least one side of said side plate and extending to one side of said internal circulation type liquid cooling radiator and a fan fixing hole arranged on said panel, said side plate having two ends thereof respectively bent with an end plate that fits on the outer walls of said first liquid collection box and said second liquid collection box, said end plates having free ends thereof bent to form the respective said locking lugs.

* * * * *